US012142338B2

(12) United States Patent
Niu et al.

(10) Patent No.: US 12,142,338 B2
(45) Date of Patent: Nov. 12, 2024

(54) MEMORY PRIMING AND INITIALIZATION SYSTEMS AND METHODS

(71) Applicant: Alibaba Group Holding Limited, Grand Cayman (KY)

(72) Inventors: Dimin Niu, Sunnyvale, CA (US); Shuangchen Li, Sunnyvale, CA (US); Tianchan Guan, Shanghai (CN); Hongzhong Zheng, Los Gatos, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 224 days.

(21) Appl. No.: 17/788,696

(22) PCT Filed: Jan. 19, 2021

(86) PCT No.: PCT/CN2021/072773
§ 371 (c)(1),
(2) Date: Jun. 23, 2022

(87) PCT Pub. No.: WO2022/155798
PCT Pub. Date: Jul. 28, 2022

(65) Prior Publication Data
US 2023/0245711 A1 Aug. 3, 2023

(51) Int. Cl.
*G11C 29/52* (2006.01)
*G11C 7/10* (2006.01)
*G11C 7/20* (2006.01)

(52) U.S. Cl.
CPC .......... *G11C 29/52* (2013.01); *G11C 7/1096* (2013.01); *G11C 7/20* (2013.01)

(58) Field of Classification Search
CPC .......... G11C 29/52; G11C 7/1096; G11C 7/20
USPC .................................................. 365/189.05
See application file for complete search history.

(56) References Cited

U.S. PATENT DOCUMENTS

| | | | |
|---|---|---|---|
| 7,219,212 B1 | 5/2007 | Sanghavi et al. | |
| 7,798,128 B2 | 9/2010 | Bellistri et al. | |
| 8,966,952 B2 | 3/2015 | Pepper | |
| 10,114,647 B2 | 10/2018 | Crook et al. | |
| 10,708,156 B2 | 7/2020 | Keller | |

(Continued)

FOREIGN PATENT DOCUMENTS

CN 107643955 A 1/2018

*Primary Examiner* — Huan Hoang

(57) ABSTRACT

The present invention provides systems and methods for efficiently and effectively priming and initializing a memory. In one embodiment, a memory controller includes a normal data path and a priming path. The normal data path directs storage operations during a normal memory read/write operation after power startup of a memory chip. The priming path includes a priming module, wherein the priming module directs memory priming operations during a power startup of the memory chip, including forwarding a priming pattern for storage in a write pattern mode register of a memory chip and selection of a memory address in the memory chip for initialization with the priming pattern. The priming pattern includes information corresponding to proper initial data values. The priming pattern can also include proper corresponding error correction code (ECC) values. The priming module can include a priming pattern register that stores the priming pattern.

20 Claims, 8 Drawing Sheets

(56) References Cited

U.S. PATENT DOCUMENTS

| | | | |
|---|---|---|---|
| 10,731,655 B2 | 8/2020 | Stiles et al. | |
| 2002/0029354 A1 | 3/2002 | Forehand et al. | |
| 2003/0011348 A1 | 1/2003 | Lof et al. | |
| 2005/0225503 A1 | 10/2005 | Weitbruch et al. | |
| 2005/0226731 A1 | 10/2005 | Mehlhorn et al. | |
| 2007/0011409 A1 | 1/2007 | Ingram et al. | |
| 2008/0059662 A1 | 3/2008 | Iwahashi et al. | |
| 2011/0078537 A1 | 3/2011 | Gruner et al. | |
| 2013/0318285 A1* | 11/2013 | Pignatelli | G06F 12/0246 711/103 |
| 2014/0245444 A1 | 8/2014 | Lutas et al. | |
| 2018/0082431 A1 | 3/2018 | Andersson et al. | |
| 2019/0137940 A1 | 5/2019 | Jentz et al. | |
| 2019/0266049 A1 | 8/2019 | Niu et al. | |
| 2020/0376290 A1 | 12/2020 | Kim et al. | |
| 2021/0025307 A1 | 1/2021 | Masoudi et al. | |

\* cited by examiner

MEMORY PRIMING AND INITIALIZATION SYSTEMS AND METHODS

FIELD OF THE INVENTION

The present invention relates to the field of information processing and communication in a memory.

BACKGROUND OF THE INVENTION

Numerous electronic technologies such as digital computers, calculators, audio devices, video equipment, and telephone systems facilitate increased productivity and cost reduction in analyzing and communicating data and information in most areas of business, science, education, and entertainment. Electronic components can be used in a number of important applications (e.g., medical procedures, vehicle aided operation, financial applications, etc.) and frequently these activities involve storing large amounts of information. In many applications it is important for systems to process information correctly and accurately. Providing correct and accurate information typically depends on starting with information that is reliable. Establishing reliable information configuration at system initialization for volatile memories can be problematic and difficult.

Some systems include information verification approaches for verifying accuracy of information stored in a memory. One conventional approach includes Error Correcting Code (ECC) features. The ECC features can include parity checking of data bits. In some conventional memories, a predetermined number of stored data bits (e.g., 32, 64, etc.) have a corresponding predetermined number of stored ECC parity bits (e.g., 4, 8, etc.) that are used to check the accuracy of the data bits. The single error correcting/double error correcting (SEC/DEC) hamming code for a double data rater version 4 (DDR4) interface is usually a 64 bit data interface and an addition 8 parity bit interface when ECC capabilities are included, for a total 72 bit interface. The SEC/DED for DDR5 interface is usually a 32 bit data interface and an addition 8 parity bit interface when ECC capabilities are included, for a total 40 bit interface.

Volatile memories typically require power to store information and do not retain information when powered down or turned off. Dynamic random access memory (DRAM) is a volatile memory that typically requires energy to store information in capacitive storage/memory cells that require repeated refreshing of the capacitive state of the storage cell. DRAMs usually operate on a basic principal that the electrical charges stored by capacitive features of memory cells correspond to the information logical state of an information bit the memory cell is storing. Due to the capacitive features and characteristics (e.g., charging, discharging, etc.), a DRAM typically engages in several operations (e.g., precharge, refresh, loop-amplification, etc.) that require energy to maintain and change the status of a memory cell. Thus, when power to the DRAM is turned off the electrical charges stored in the capacitive features of the DRAM are dissipated or discharged and the corresponding information is lost or gone. This poses particular problems for systems implementing ECC storage because both the logical values of the data bits and the respective corresponding ECC parity bits are gone when power is turned off.

Since the previous logical states of the memory cells dissipate or are lost when the power is in the off, the values of the data bits and corresponding ECC parity bits are typically not known for sure when power is turned on in a DRAM with ECC verification features. If proper relationships between the data bits and ECC bits are not established during start up or powering up of a memory, when the memory controller performs a parity check (e.g., calculates the parity, etc.) the ECC bits may indicate errors in the initial state of the information. Priming processes are often used to start up or initialize a DRAM with ECC. Traditional priming processes typically include software/operating system (OS) approaches or hardware approaches.

Traditional software/OS approaches usually utilize direct memory access (DMA), central processing unit (CPU) writes, or memory set (memset) features to establish initial stored memory values. Software approaches usually include system initialization, disabling ECC, software priming, and re-enabling ECC. In a DMA approach the software priming often involves writing logical values from a fixed source address to the addresses within the DRAM range. In the CPU write approach the software priming usually involves a loop of 32 bit store operations from the start until the end address of the DRAM. In the memset approach the priming operation typically involves writing from a destination pointer to the start address of the DRAM, and the length is the size of the DRAM. The software approaches are typically not able to start from time zero, have low efficiency (e.g., low latency low power, etc.), and require disabling and enabling of ECC features during priming operations.

Traditional hardware approaches usually have a memory controller set all configured memory to a default value such as a logical zero or a preprogrammed pattern. The traditional hardware approaches also attempt to set the corresponding ECC bits to valid values. While the conventional hardware approaches may be more efficient than traditional software/OS approaches, traditional hardware approaches proceed with each write operation for a corresponding memory addresses putting the corresponding data pattern on the data bus for each write to one address after another. Traditional hardware approaches are also typically limited to working through memory rank levels in a sequential manner. Similar to traditional software/OS approaches, traditional hardware approaches often require disabling and enabling of ECC features during priming operations.

SUMMARY OF THE INVENTION

The present invention provides systems and methods for efficiently and effectively priming and initializing a memory. In one embodiment, a memory controller includes a normal data path and a priming path. The normal data path directs storage operations during a normal memory read/write operation after power startup of a memory chip. The priming path includes a priming module, wherein the priming module directs memory priming operations during a power startup of the memory chip. The priming module can include a priming pattern register that stores the priming pattern. The memory priming operations can include forwarding a priming pattern from a priming pattern register (e.g., in a memory controller, etc.) for loading in a write pattern mode register in a memory chip. The memory priming operations can also include selection of a memory address in the memory chip for initialization with the priming pattern. The priming pattern includes information corresponding to proper initial data values. The priming pattern can also include proper corresponding error correcting code (ECC) values.

In one embodiment, the memory module directs loading of the priming pattern from the priming pattern register in the memory module into a write pattern mode register on a memory chip. The priming module can include: a priming range start address register that stores a start address of a memory address range, and a priming range end address register that stores an end address of a memory address range. The selection of the memory address can be based upon incrementing address values from the priming range start address to the priming range end address. The priming module can include a priming level (PL) register that stores a level parallelism definition value that indicates a level of parallel priming write operations. In one embodiment, the parallel priming write operations can be performed on a rank basis. In one exemplary implementation, the memory priming module directs a write pattern operation based upon the memory address. The write pattern operation can write pattern information from a write pattern mode register in the memory chip to memory cells in the memory chip corresponding to the memory address. The priming module can include a priming write (MRW) command to direct programming of the memory chip with the priming pattern, wherein the priming pattern is loaded from the priming pattern register in the priming module of the memory controller to a write pattern mode register in the memory chip. In one exemplary implementation, the memory is a dynamic random access memory (DRAM) and the memory priming operations include a double data rate version 5 (DDR5) error correcting code (ECC) compatible write pattern operation.

In one embodiment a memory priming method comprises: performing a priming programming process and directing a priming control operation. The priming programming process includes programming a priming module in a memory controller with a priming pattern and memory range address information. Directing a priming control operation includes: forwarding a priming pattern for loading in a write pattern mode register of a memory chip; generating a memory address of the memory chip to be initialized and primed; and issuing a write operation command that directs writing of the priming pattern from the write pattern mode register in a memory chip to memory cells in the memory chip, wherein the memory cells correspond to the memory address. The memory chip can be one of a plurality of memory chips and the directing a priming control operation is performed for a plurality of memory chips at least in part in parallel. In one exemplary implementation, a priming operation is performed on the memory chip in accordance with the priming pattern and memory address. The memory controller can be one of a plurality of memory controllers and the priming programming operation is performed on the plurality of memory controllers at least in part in parallel.

In one embodiment, a memory priming method further comprises executing a priming operation on the memory chip. Executing a priming operation on the memory chip can include storing received pattern information in a write pattern mode register on the memory chip. Executing a priming operation on the memory chip can include writing pattern information from the write pattern mode register to memory cells of the memory chip in response to a received write command. The memory cells can correspond to the memory address in the memory chip that is initialized and primed. The memory chip can be one a plurality of memory chips and the executing a priming operation is performed on the plurality of memory chips at least in part in parallel. The memory range address information can include a memory range start address and memory range end address. The generating the memory address can include establishing the memory address according to the memory range start address and memory range end address. Issuing the write command operation can be performed without data information on a data bus.

In one embodiment, a memory system includes a plurality of memory modules and a memory controller. The plurality of memory modules are configured to store information, wherein a first one of the plurality of memory modules includes a first set of multiple memory chips and a second one of the plurality of memory modules includes a second set of multiple memory chips. The memory controller includes a priming module, wherein the priming module is configured to direct memory priming operations during the power startup of the plurality of memory modules. The memory priming operation can include forwarding a priming pattern for storage in respective write pattern mode registers on the first set of memory chips and the second set of memory chips, selection of a memory address in the respective first set of memory chips and the second set of memory chips for initialization with the priming pattern. The memory priming operations can also include directing a write pattern operation of information from the respective write pattern mode registers to the respective selected memory address.

The first set of memory chips and the second set of memory chips can be organized in multiple ranks and the write pattern operation can be performed substantially in parallel in the first set of chips and second set of chips on a rank level basis. A plurality of the multiple ranks can be enabled at substantially the same time by asserting a corresponding plurality of rank enable signals. In one exemplary implementation, a command/address bus and a data bus communicatively couples the memory controller to the plurality of memory modules, wherein the write pattern operation command is issued with a generated address on the command/address bus without pattern data on the data bus.

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The accompanying drawings, which are incorporated in and form a part of this specification, are included for exemplary illustration of the principles of the present invention and are not intended to limit the present invention to the particular implementations illustrated therein. The drawings are not to scale unless otherwise specifically indicated. Embodiments of the present technology are illustrated by way of example and not by way of limitation, in the figures of the accompanying drawings and in which like reference numerals refer to similar elements. The drawings are not necessarily to scale unless otherwise indicated.

DETAILED DESCRIPTION OF THE INVENTION

Figure 1:
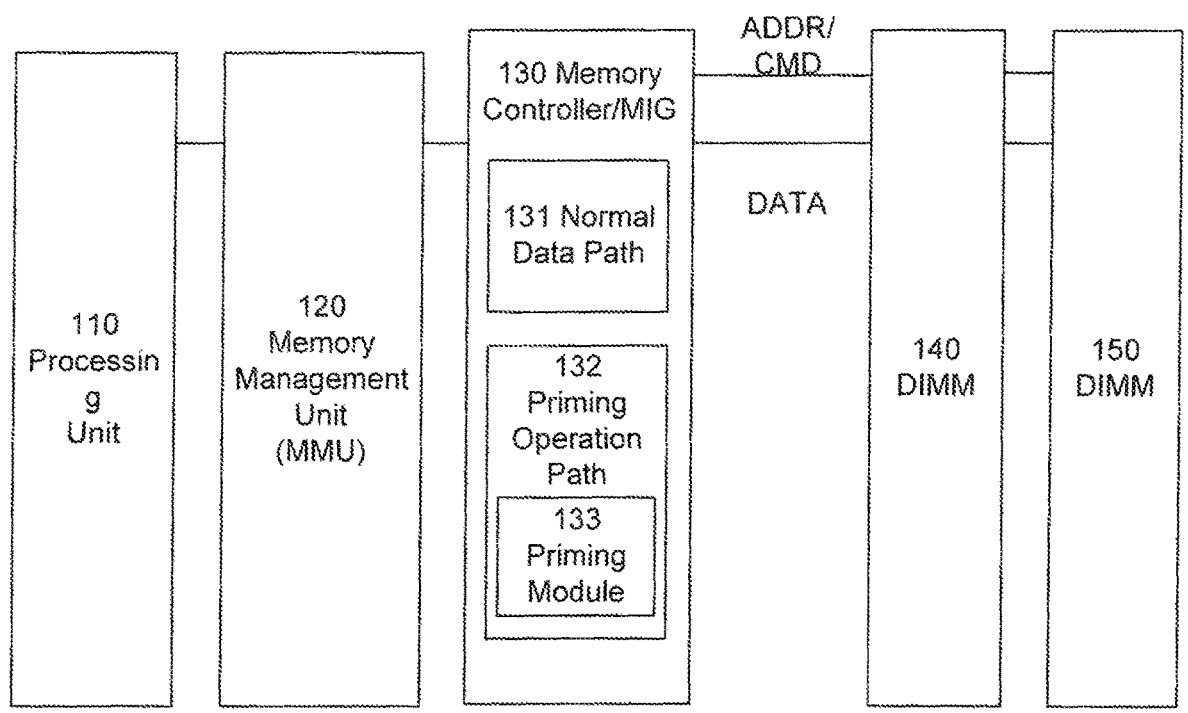
FIG. 1 is block diagram of computer system in accordance with one embodiment.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the phraseology and terminology used herein is for the purpose of description and should not be regarded as limiting.

The systems and methods facilitate efficient and effective power start up and initialization of memory storage resources. In one embodiment, the memory initialization priming systems and methods are faster than typical traditional systems and methods. In one exemplary implementation, the memory initialization priming systems and methods enable parallel loading and storing of priming data (e.g., in multiple memory chips, for multiple ranks, across multiple memory modules, etc.). The loading and storing operations can be performed independently in response to separate commands. The priming data can be loaded into registers on multiple memory chips as part of a first operation (e.g., in response to a first command, trigger, etc.). The priming data can be written from the registers on the memory chips and stored in memory cells. The writing and storing from the registers to the memory cells can be performed in response to a command/trigger without simultaneous priming data on a data bus (e.g., unlike conventional approaches, etc.). Avoiding the repeated toggling of data on a data bus enables the initialization priming systems and methods to consume less power than traditional systems. In one embodiment, traditional system disabling and enabling ECC operations as part of priming memory.

FIG. 1 is an exemplary block diagram of computer system 100 in accordance with one embodiment. Computer system 100 includes central processing unit 110, memory management unit 120, memory controller 130, memory module 140, and memory module 150. Central processing unit 110 is communicatively coupled to memory management unit 120 which is communicatively coupled to memory controller 130. Memory controller 130 is communicatively coupled to memory module 140 and memory module 150. Memory module 140 and memory module 150 store information. Central processing unit 110 processes information stored in memory module 140 and memory module 150. Memory management unit 120 manages the storage of information in memory module 140 and memory module 150. Memory controller 130 directs access to memory module 140 and memory module 150. Memory module 140 and memory module 150 can be dual in lime memory modules (DIMMs).

In one embodiment, memory controller 130 includes a normal data path for directing normal data accesses to memory modules 140 and 150. Memory controller 130 also includes a priming operation path 132 directing power start up and initialization priming operations in memory modules 140 and 150. In one embodiment, the priming operation path 132 includes priming module 133. Priming module 133 directs loading of priming pattern information into write pattern mode registers in memory chips on memory modules

140 and 150. Priming module 133 also directs priming operations including generating addresses and issuing write pattern commands that direct the memory chips to write the priming pattern from the write pattern mode register to the memory addresses without data on the data bus.

It is appreciated the initialization priming systems and methods are compatible with various standards. In one embodiment, the initialization priming systems and methods are compatible with double data rate implementations. In one exemplary implementation, the initialization priming systems and methods are compatible with DDR5 implementations.

Figure 2:
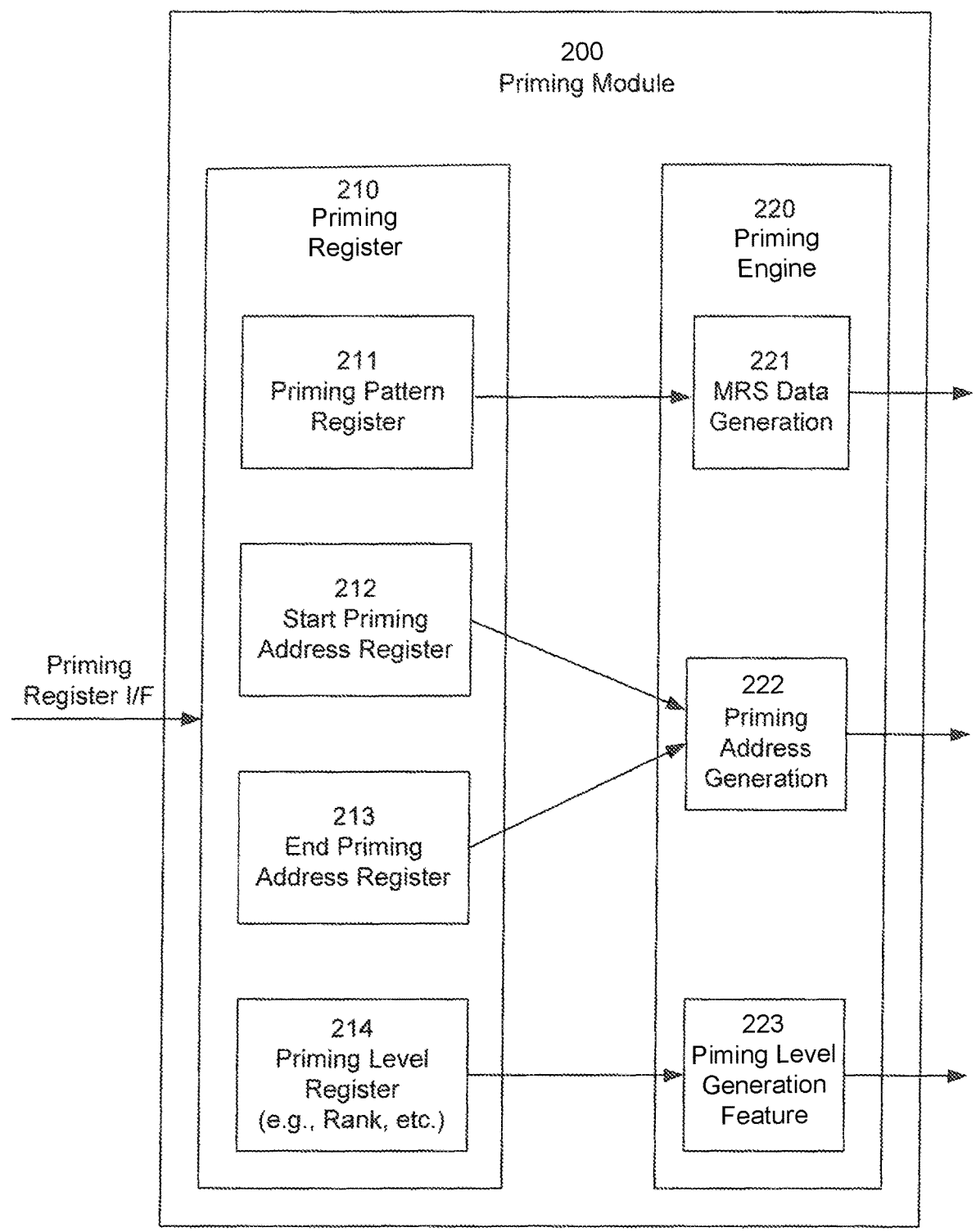
FIG. 2 is a block diagram of a priming module in accordance with one embodiment.

FIG. 2 is a block diagram of an exemplary priming module 200 in accordance with one embodiment. In one embodiment, priming module 200 is similar to priming module 133. In one exemplary implementation, priming module 200 operates as a programmable register interface. The priming module 200 includes priming registers 210 and priming engine 220. The priming registers 210 includes priming pattern register 211, start priming address register 212, end priming address register 213, and priming level register 214. Priming engine 220 includes mode register set (MRS) data generation features 221, priming address generation features 222, and priming level generation features 223. In one embodiment, the priming level generation features 223 includes MRS data generation features (e.g., at a rank level, etc.).

The components of priming module 200 cooperatively operate to direct priming and initialization of memory chips. The memory chips can be included in memory modules. Priming pattern register 211 stores priming pattern information. Start priming address register 212 stores a start address of a priming range to be primed and initialized. End priming address register 213 stores an end address of a priming range to be primed and initialized. Priority level register 214 stores an indication of a level of memory components (e.g., bank, module, rank, etc.) that are primed and initialized substantially in parallel or at the same time. MRS data generation components 221 generate mode register set (MRS) or memory register write (MRW) data for loading in write pattern mode registers of memory chips based upon the priming pattern information stored in priming pattern registers 211. Priming address generation feature 222 generates addresses based upon the information in start priming address register 212 and end priming address register 213. In one embodiment, priming level generation features 223 generate command information for a level of parallelism. In one exemplary implementation, priming level generation features 223 generate chip enable indications/signals for a level (e.g., module, rank, etc.) of substantially parallel/simultaneous enablement.

In one embodiment, a channel can include multiple memory modules. The memory modules can share an address bus and a data bus. In one exemplary implementation, multiple memory modules cannot be enabled and data conveyed to a different or second address at the same time (e.g., cannot have different addresses on the shared address bus while different data is on the data bus, etc.). However, in one embodiment, preloading priming pattern data in respective write pattern mode registers on the respective memory chips and issuing write pattern operation command with same addresses on the address and command buses with more than one channel/rank enable signal (e.g. chip select ID, etc.), and with no pattern data on the data bus enables multiple memory chips to be primed in parallel.

Figure 3:
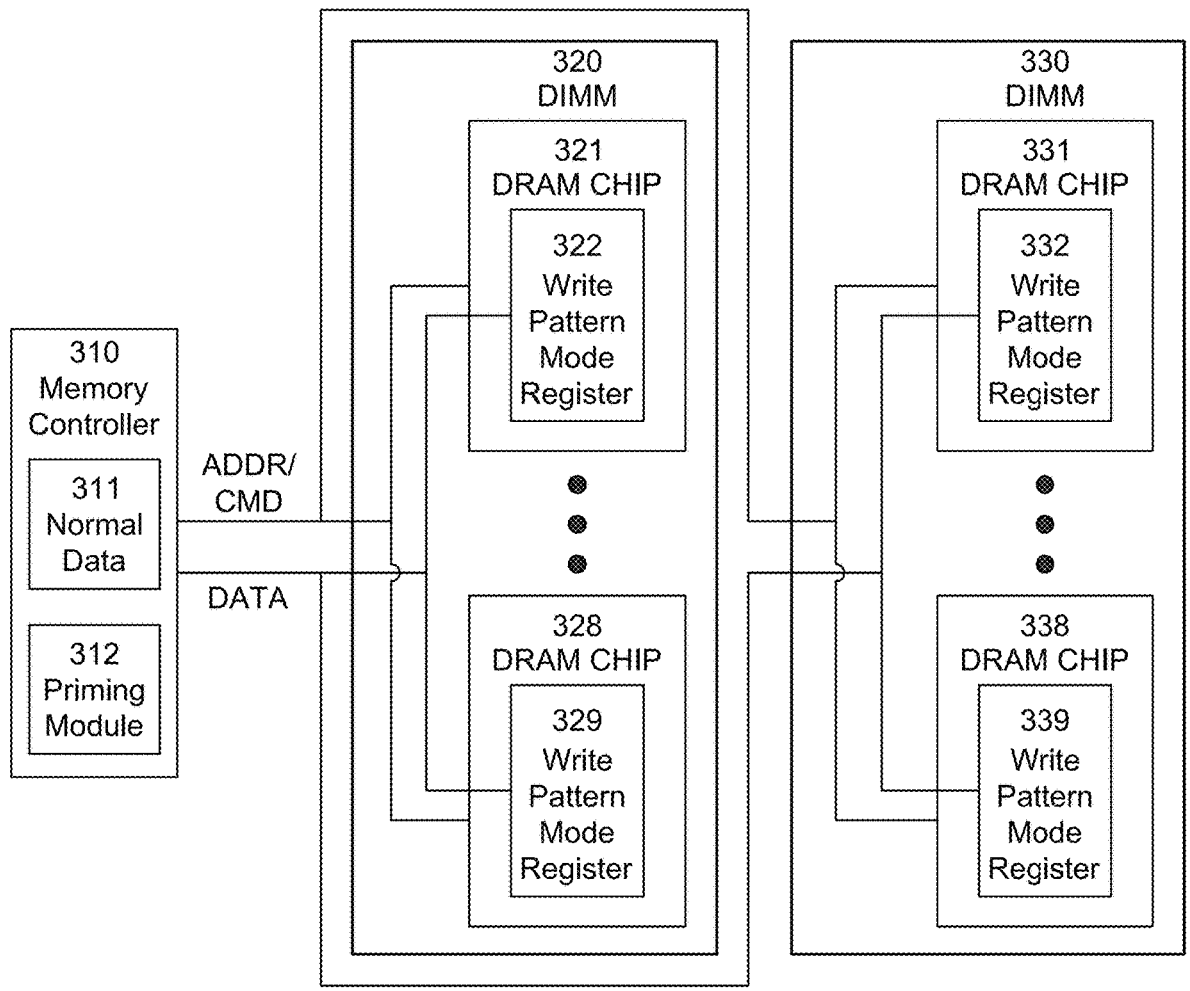
FIG. 3 is a block diagram of a memory system in accordance with one embodiment.

FIG. 3 is a block diagram of an exemplary memory system 300 in accordance with one embodiment. Memory system 300 includes memory controller 310, memory module 320, and memory module 330. Memory controller 310 includes normal data path 311 and a priming path including priming module 312. Memory module 320 includes memory chip 321 and 328 which include write pattern mode register 322 and write pattern mode register 329, respectively. Memory module 330 includes memory chip 331 and 338 which include write pattern mode register 332 and write pattern mode register 339, respectively. Memory pattern mode registers 322, 329, 332, and 339 store priming pattern information received from priming module 312. Memory chips 321, 328, 331, and 338 write the priming pattern information from memory pattern mode registers 322, 329, 332, and 339 respectively into memory cells in response to receiving a pattern write command and addresses from priming module 312.

In one embodiment, priming module 312 issues a MRS or MRW command to program the memory chips, wherein programming the memory chips includes loading priming pattern data from registers in priming module 312 into the respective write pattern mode registers (e.g., 322, 329 332. 339, etc.). In one exemplary implementation, the priming pattern data is loaded via the data bus to multiple DRAM chips at the substantially the same time (e.g., in response to a single MRS command, etc.). Loading the priming data into respective write pattern mode registers of multiple memory chips at the substantially the same time can avoid repeated toggling on a data bus for the dram chips separately as often required in traditional approaches. The priming module 312 generates DRAM addresses to be primed. In one exemplary implementation, the DRAM address to be primed includes a DRAM address sequence corresponding to an increment of memory addresses from the priming address start to the priming address end. The priming module 312 can direct issuance of chip select or chip enable signals to the respective DRAM chips (e.g., 321, 331, 328, 338, etc.) at substantially the same time in parallel. The priming module 312 can issue a write pattern operation command to direct writing and storing of the priming pattern data from the respective write pattern mode registers to memory cells of the respective memory chips corresponding to the DRAM addresses to be primed. The indication of the DRAM addresses to be primed and the write pattern operation command can be conveyed to the respective DRAM chips (e.g., 321, 331, 328, 338, etc.) via the address/command bus without pattern data simultaneously being communicated/toggled on the data bus.

It is appreciated different DRAM chips can be programmed with different priming patterns. In one embodiment, the pattern data is loaded one by one in DRAM's via a per-dram addressable (PDA) mode. In one exemplary implementation, a mode of addressing on an independent DRAM basis enables different priming information with different data patterns to be loaded in different DRAMs.

In one embodiment, since the priming data is written from the write pattern mode registers on the memory chip, the information does not involve ECC check in the memory controller and the ECC is not disabled and enabled as part of the priming process. In one exemplary implementation, the ECC can be disabled and enabled for reasons other than part of the priming process.

Figure 4:
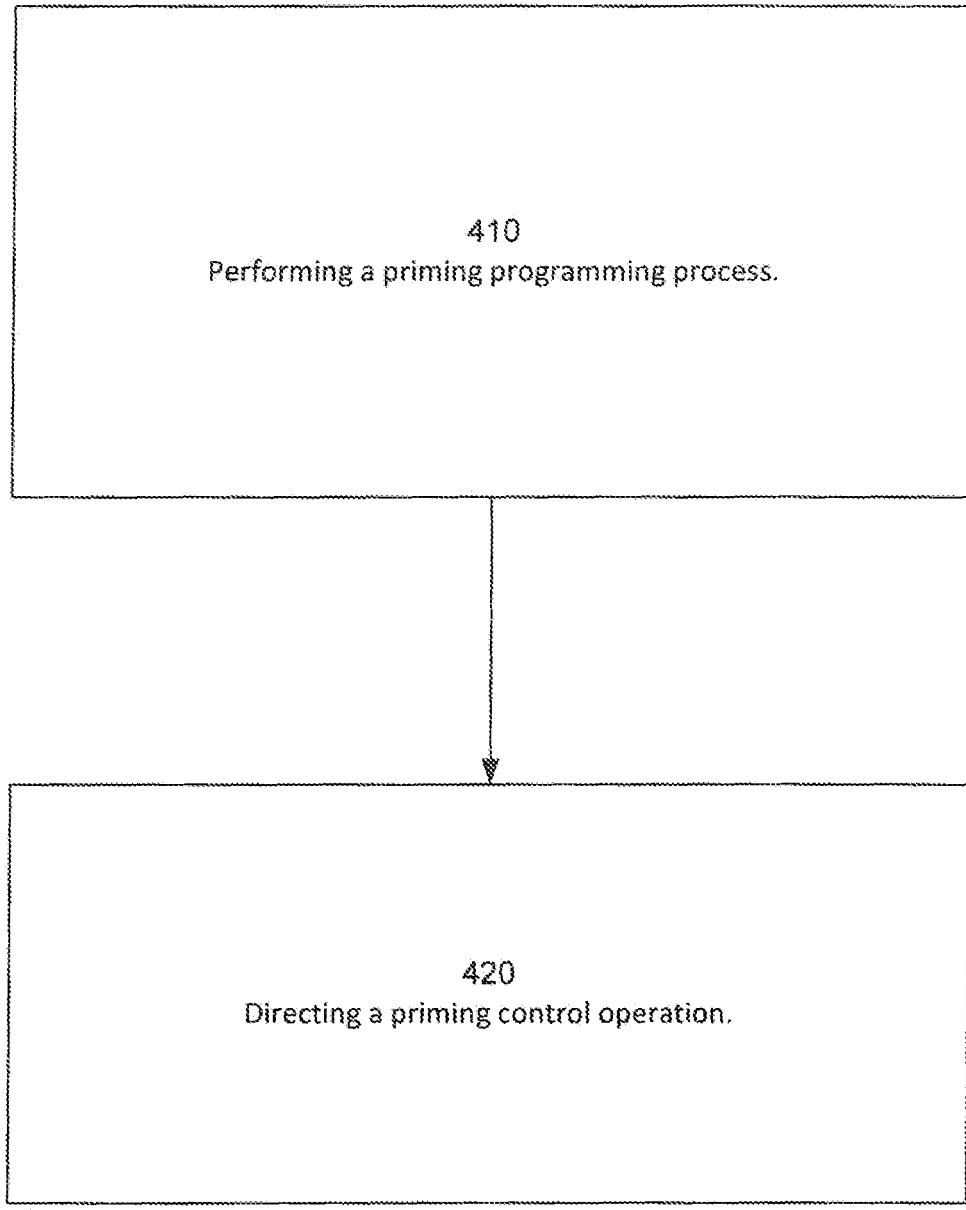
FIG. 4 is a flow chart of an exemplary memory priming method in accordance with one embodiment.

FIG. 4 is a flow chart of an exemplary memory priming method 400 in accordance with one embodiment. In one embodiment, the memory priming method 400 is compatible with DDR implementations and requirements.

In block 410, a priming programming process is performed. The priming programming process includes programming a priming module in a memory controller with a priming pattern and memory range address information. The priming pattern and memory range address information is automatically generated for each region. In one exemplary implementation, memory size is automatically determined by the hardware or a software kernel. In one exemplary implementation, once the memory size is determined the priming start and end addresses are established. In one embodiment, an isolated memory region (IMR) command is utilized.

In block 420, a priming control operation is performed. Directing a priming control operation can include forwarding priming pattern data for loading in a write pattern mode register in a memory chip. The priming pattern data can be forwarded from a memory controller to the memory chip. In one embodiment, a mode or memory register write (MRW) command is utilized to direct loading and programing of priming pattern information to a write pattern mode register in a memory chip. A priming control operation can include generating a memory address of the memory chip to be initialized and primed with the priming pattern data. A priming control operation can include enabling multiple memory chips for priming at the same time by asserting respective chip enable signals. The multiple memory chips can be enabled based upon a level of memory components (e.g., bank, module, rank, etc.) that are primed and initialized substantially in parallel. In one embodiment, a priming control operation can include issuing a write operation command that directs writing of the priming pattern from the write pattern mode register in a memory chip to memory cells in the memory chip corresponding to the memory address.

The memory chip can be one of a plurality of memory chips and the priming programming operation is performed on the plurality of memory chips at least in part in parallel. In one exemplary implementation, a priming operation is performed on the memory chip in accordance with the priming pattern and memory address. The execution of a priming operation, include issuing a write command to direct a write operation along with the generated addresses without data information on a data bus can be performed on the plurality of memory chips at least in part in parallel. The memory range address information can include a memory range start address and memory range end address, and the generating the memory address includes establishing the memory address according to the memory range start address and memory range end address.

In one embodiment, priming pattern data can be the same for a plurality of memory addresses. In one embodiment, priming pattern data can be different for a plurality of memory address. The similarity and differences of priming pattern data for respective memory address can be based upon different levels of memory hierarchy organization. In one embodiment, priming pattern data is the same for a plurality of memory modules. In one embodiment, priming pattern data can vary for different ones of a plurality of memory module and respective components.

Figure 5:
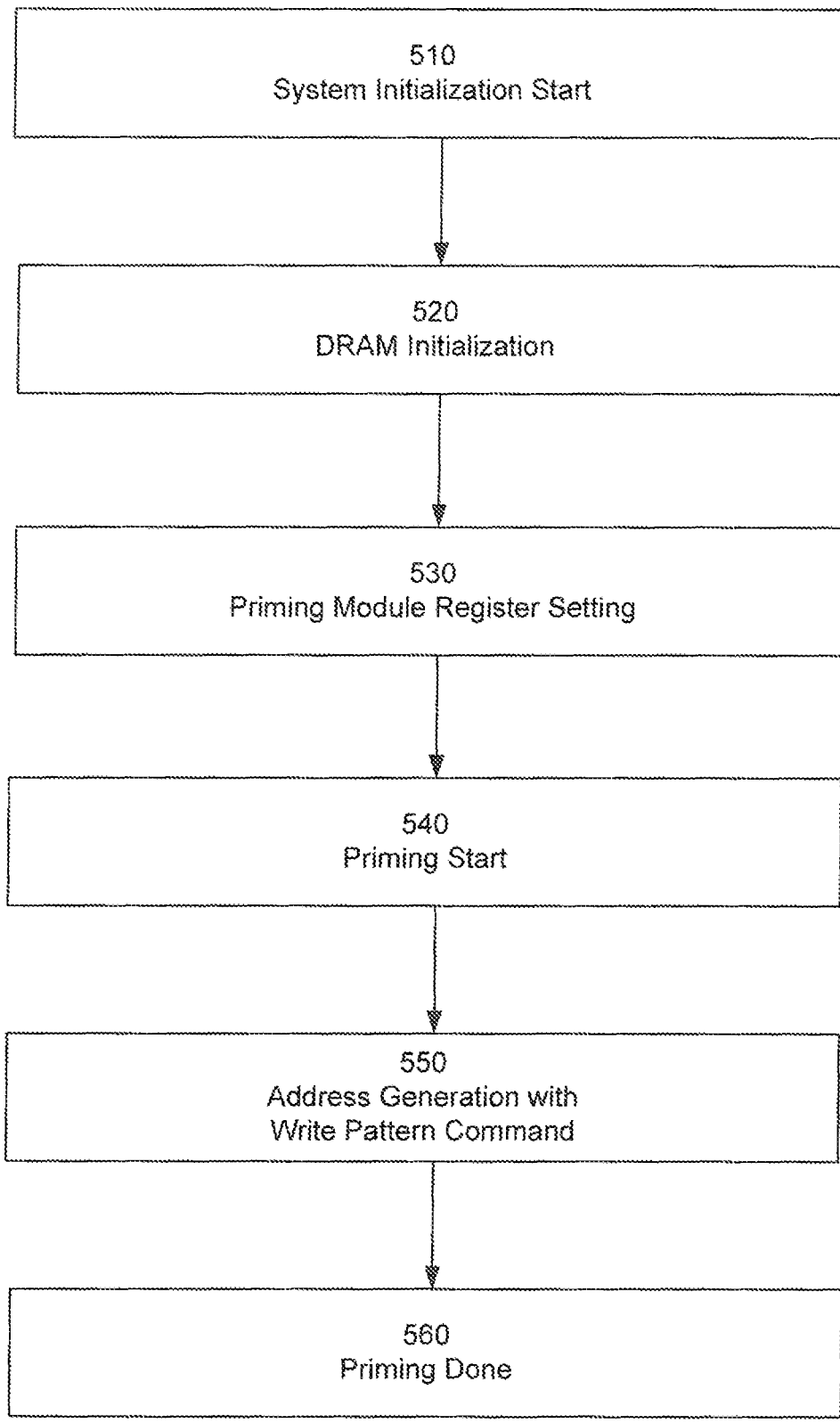
FIG. 5 is a flow chart of another exemplary memory priming method in accordance with one embodiment.

FIG. 5 is a flow chart of an exemplary priming process method 500 in accordance with one embodiment.

In block 510, a system initialization is started. In one embodiment, power is turned on to the system In block 520, a DRAM initialization process is initiated in response to the system initialization.

In block 530, a priming module register is set. In one embodiment, a priming pattern is set in a priming pattern register.

In block 540, priming starts. In one embodiment, a priming pattern is loaded from priming pattern register in a memory controller priming module to a write pattern mode register in a memory chip. In one exemplary implementation, a write pattern mode register can be included in an input/output (I/O) part of a memory chip periphery circuitry.

In block 550, an address is generated with a write pattern command. In one embodiment the address and write pattern command are issued to a memory chip without data on a data bus. In one exemplary implementation, the address and write pattern command are issued to a plurality of memory chips at substantially the same time in parallel.

Figure 6:
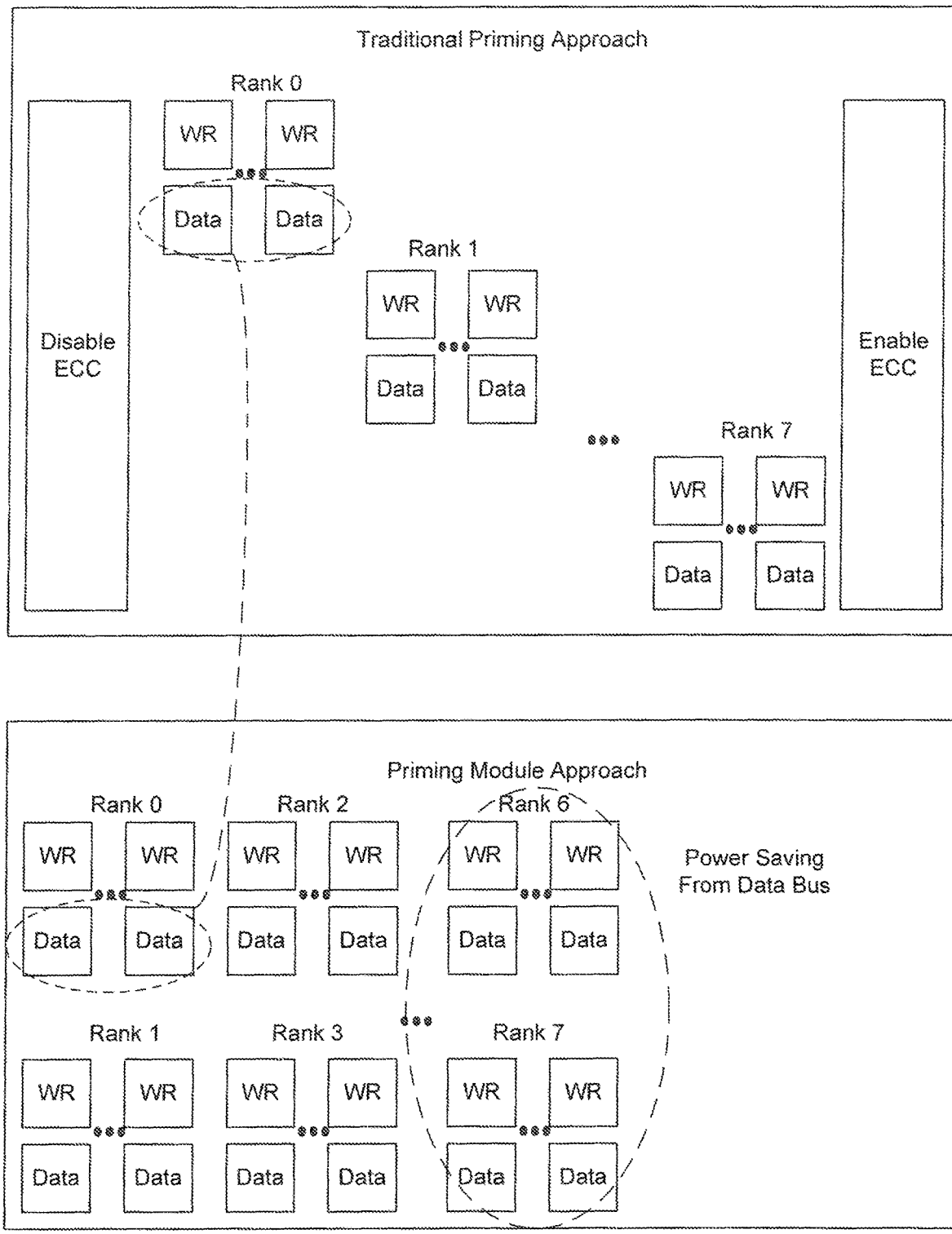
FIG. 6 is a comparison of a typical traditional memory priming approach to memory controller priming module approach in accordance with one embodiment.

In bloc 560, priming operations are completed. In one embodiment, a system is notified the priming operations are complete and a memory is initialized, FIG. 6 is a comparison of a typical traditional memory priming approach to memory controller priming module approach in accordance with one embodiment. In a typical traditional priming approach (e.g., shown in top portion of FIG. 6), ECC is disabled, a rank 0 is primed, then rank 1 is primed, and so on. With regards to the respective ranks, a write command is issued while the priming data is being toggled on the data bus. Eventually, rank 7 is primed and then the ECC is enabled again. An exemplary new initialization priming approach (e.g., shown in bottom portion of FIG. 6) can include various efficiencies compared to the traditional priming approach. Time an energy is saved by not disabling and enabling ECC features in the new initialization priming systems and methods. In one embodiment, multiple ranks are programmed in parallel.

It is appreciated priming systems and methods can be utilized with EEC compatible memory configurations and non-ECC compatible memory configurations. In one exemplary implementation, priming systems and methods are utilized with a ECC DRAM DIMM. In one exemplary implementation, priming systems and methods are utilized with non-ECC DRAM DIMM.

Figure 7:
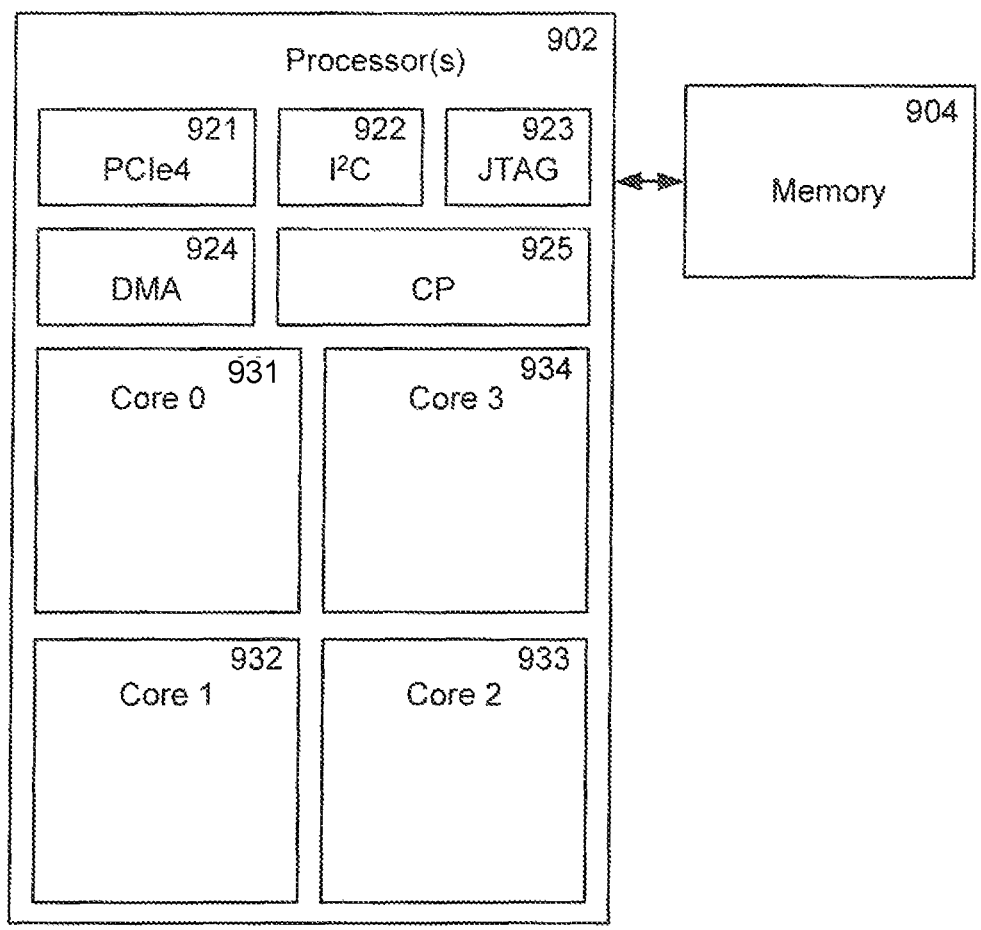
FIG. 7 is a block diagram of an exemplary computing system for storing and processing information in accordance with one embodiment.

FIG. 7 is a block diagram of an exemplary computing system 900 for storing and processing information in accordance with one embodiment. In one embodiment, a memory chip is included in memory 904 (e.g., similar to memory system 100, 200, 400, etc.). The computing system 900 can include processors 902 and memory 904. In one implementation, the computing system 900 can be a server computer, a data center, a cloud computing system, a stream service system, an internet service provider system, a cellular service provider system, or the like. The processors 902 can be central processing units (CPU), graphics processing units (GPU), neural processing units (NPU), vector processors, memory processing units, or the like, or combinations thereof. In one implementation, a processor 902 can include communication interfaces, such as peripheral component interface (PCIe4) 921 and inter-integrated circuit (I2C) interface 922, an on-chip circuit tester, such as a joint test action group (JTAG) engine 923, a direct memory access engine 924, a command processor (CP) 925, and cores 931-934. The cores 931-934 can be coupled in a direction ring bus configuration.

Referring still to FIG. 7, the cores 931-934 can execute sets of computing device executable instructions to perform functions including, but not limited to performing a narrow channel conversion memory control method. The functions can be performed on individual core 931-934, can be distributed across a plurality of cores 931-934, can be performed along with other functions on cores, and or the like. In one embodiment, initialization priming operations are performed on memory 904.

Figure 8:
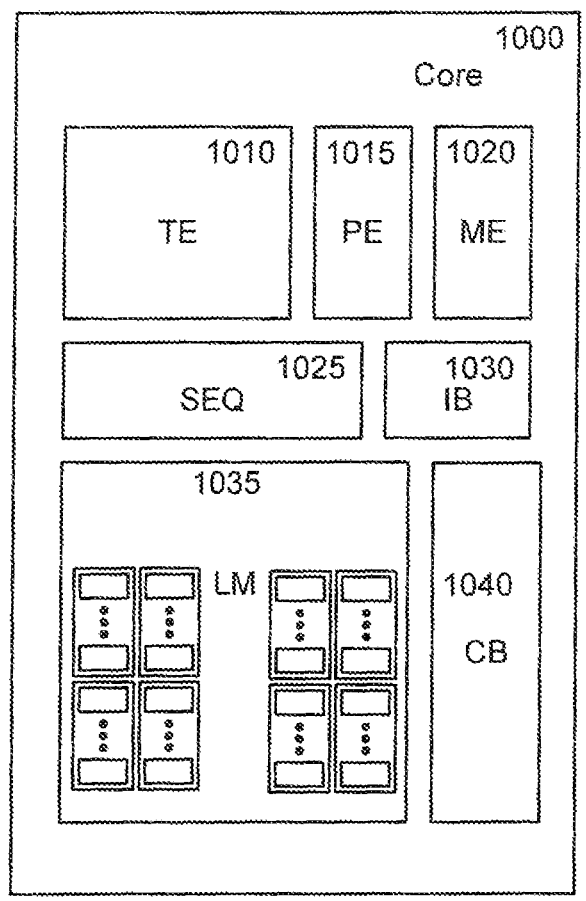
FIG. 8 is a block diagram of an exemplary processing core configuration in accordance with one embodiment.

FIG. 8 is a block diagram of an exemplary processing core configuration 1000 in accordance with one embodiment. In one embodiment, components of processing core configuration 1000 participate in memory priming operations. The processing core configuration 1000 can include a tensor engine (TE) 1010, a pooling engine (PE) 1015, a memory copy engine (ME) 1020, a sequencer (SEQ) 1025, an instructions buffer (IB) 1030, a local memory (LM) 1035, and a constant buffer (CB) 1040. The local memory 1035 can be pre-installed with model weights and can store in-use activations on-the-fly. The constant buffer 1040 can store constant for batch normalization, quantization and the like. The tensor engine 1010 can be utilized to accelerate fused convolution and or matrix multiplication. The pooling engine 1015 can support pooling, interpolation, region-of-interest and the like operations. The memory copy engine 1020 can be configured for inter- and or intra-core data copy, matrix transposition and the like. The tensor engine 1010, pooling engine 1015, and memory copy engine 1020 can run in parallel. The sequencer 1025 can orchestrate the operation of the tensor engine 1010, the pooling engine 1015, the memory copy engine 1020, the local memory 1030, and the constant buffer 1040 according to instructions from the instruction buffer 1030. The processing core configuration 1000 can provide video coding efficient computation under the control of operation fused coarse-grained instructions. A detailed description of the exemplary processing core configuration 1000 is not necessary to an understanding of aspects of the present technology, and therefore will not be described further herein.

Thus, the initialization priming systems and methods facilitate efficient and effective power start up and initialization of memory storage resources. In one embodiment, the memory initialization priming systems and methods overcome a number of issues associated with conventional/traditional approaches. For example, the initialization priming systems and methods can begin rapidly at close to time zero, unlike conventional software/hardware approaches that have a number of efficiency issues with regards to latency and power consumption (e.g., usually require disablement/enablement of ECC features, cannot start from time zero, no parallelism at memory controller (MC) level or memory module level, requirement of software/operating system (SW/OS) solution, etc.). The initialization priming systems and methods enable faster speeds and lower power consumption compared to typical conventional approaches.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory controller including:
   a normal data path that directs storage operations during a normal memory read/write operation after a power startup of a memory chip; and
   a priming path that includes a priming module, wherein the priming module directs memory priming operations during the power startup of the memory chip, including forwarding a priming pattern for loading in a write pattern mode register in the memory chip and selection of a memory address in the memory chip for initialization with the priming pattern.

2. The memory controller of claim 1, wherein the priming pattern includes information corresponding to proper initial data values and corresponding error correction code (ECC) values for ECC compatible memory.

3. The memory controller of claim 1, wherein the priming pattern includes information corresponding to proper initial data values for non ECC compatible memory.

4. The memory controller of claim 1, wherein the priming module includes a priming pattern register that stores the priming pattern, and wherein the memory priming module directs loading of the priming pattern from the priming pattern register in the memory priming module into the write pattern mode register on the memory chip.

5. The memory controller of claim 1, wherein the priming module includes:
   a priming range start address register that stores a start address of a memory address range, and
   a priming range end address register that stores an end address of the memory address range,
   wherein the selection of the memory address is based upon incrementing address values from the priming range start address to the priming range end address.

6. The memory controller of claim 1, wherein the priming module includes a rank priming level (PL) register that stores a rank level parallelism definition value that indicates a level of parallel priming write operations on a rank basis.

7. The memory controller of claim 1, wherein the priming module directs a write pattern operation based upon the selected memory address, wherein the write pattern operation writes priming pattern information stored in a write pattern mode register in the memory chip to memory cells in the memory chip corresponding to the selected memory address.

8. The memory controller of claim 1, wherein the priming module includes a priming engine that issues a memory register write (MRW) command to direct programming of the memory chip with the priming pattern, wherein the priming pattern is loaded from a priming pattern register in the priming module of the memory controller to the write pattern mode register in the memory chip.

9. The memory controller of claim 1, wherein the memory chip is a dynamic random access memory (DRAM) chip and the memory priming operations include a double data rate version 5 (DDR5) error correction code (ECC) compatible write pattern operation.

10. A memory priming method comprising:
    performing a priming programming process, including programming a priming module in a memory controller with a priming pattern and memory range address information; and
    directing a priming control operation, including:
      forwarding a priming pattern for loading in a write pattern mode register of a memory chip; and
      generating a memory address in the memory chip to be initialized and primed; and
      issuing a write operation command that directs writing of the priming pattern from the write pattern mode register of the memory chip to memory cells in the memory chip corresponding to the memory address.

11. The memory priming method of claim 10, wherein the memory chip is one of a plurality of memory chips and the directing a priming control operation is performed on the plurality of memory chips at least in part in parallel.

12. The memory priming method of claim 10, further comprising executing a priming operation on the memory chip in accordance with the priming pattern and memory address.

13. The memory priming method of claim 12, wherein the memory chip is one of a plurality of memory chips and the executing a priming operation is performed on the plurality of memory chips at least in part in parallel.

14. The memory priming method of claim 10, wherein the memory range address information includes a memory range start address and memory range end address, and the generating the memory address includes establishing the memory address according to the memory range start address and memory range end address.

15. The memory priming method of claim 10 wherein issuing the write operation command is performed without data information on a data bus.

16. The memory priming method of claim 10, wherein the memory controller is one of a plurality of memory controllers and the priming control operation is performed on the plurality of memory controller at least in part in parallel.

17. A memory system including:
a plurality of memory modules configured to store information, wherein a first one of the plurality of memory modules includes a first set of multiple memory chips and a second one of the plurality of memory modules includes a second set of multiple memory chips;
a memory controller including a priming module, wherein the priming module is configured to direct memory priming operations during a power startup of the plurality of memory modules, including:
forwarding a priming pattern for storage in a respective write pattern mode registers of the first set of memory chip and the second set of memory chips, selection of a memory address in the respective first set of memory chips and the second set of memory chips for initialization with the priming pattern, and directing a write pattern operation command of information from the respective write pattern mode registers to the respective selected memory address.

18. The memory system of claim 17 wherein the first set of memory chips and the second set of memory chips are organized in multiple ranks and the write pattern operation is performed substantially in parallel in the first set of chips and second set of chips on a rank level basis.

19. The memory system of claim 18 wherein a plurality of the multiple ranks are enabled at substantially the same time by asserting a corresponding plurality of rank enable signals.

20. The memory system of claim 17 wherein a command/address bus and a data bus communicatively couples the memory controller to the plurality of memory modules, wherein the write pattern operation command is issued with a generated address on the command/address bus without pattern data on the data bus.

* * * * *